(12) United States Patent
Askew

(10) Patent No.: US 6,566,596 B1
(45) Date of Patent: *May 20, 2003

(54) MAGNETIC AND ELECTRIC SHIELDING OF ON-BOARD DEVICES

(75) Inventor: Ray Askew, Hillsboro, OR (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/998,615

(22) Filed: Dec. 29, 1997

(51) Int. Cl.[7] ................................................. H05K 9/00
(52) U.S. Cl. ...................... 174/35 MS; 361/752; 361/753; 174/51; 174/52.2; 257/659; 257/790
(58) Field of Search ................................. 257/659, 660, 257/790; 174/35 R, 35 MS, 51, 52.2; 361/816, 818, 753, 752, 799, 800

(56) References Cited

U.S. PATENT DOCUMENTS

| | | | |
|---|---|---|---|
| 4,858,075 A | * 8/1989 | Butterworth | ................ 361/739 |
| 5,394,304 A | * 2/1995 | Jones | .......................... 361/765 |
| 5,557,064 A | * 9/1996 | Isern-Flecha et al. | .. 174/35 MS |
| 5,561,265 A | * 10/1996 | Livshits et al. | ......... 174/35 GC |
| 5,639,989 A | 6/1997 | Higgins, III | |
| 5,703,761 A | 12/1997 | Heiss | |
| 5,814,882 A | 9/1998 | Shimada et al. | |
| 5,864,088 A | * 1/1999 | Sato et al. | .............. 174/35 MS |
| 5,998,867 A | * 12/1999 | Jensen et al. | ................ 257/729 |

* cited by examiner

Primary Examiner—Hung V. Ngo
(74) Attorney, Agent, or Firm—Blakely, Sokoloff, Taylor & Zafman LLP

(57) ABSTRACT

Improved electromagnetic compatibility for integrated motherboard or device board designs is provided by magnetic shielding, electric shielding, or both integrated into the chip packaging materials. Motherboard emissions may be reduced by use of the shielding. A nonconductive primary and tertiary layer sandwich a high-conductivity metal secondary layer forming a Faraday cage for electric field shielding. A nonconductive primary layer is covered by a tertiary layer formed of a composite having permeable material for magnetic shielding. The tertiary layer formed of a composite could include a high permeability particulate ferrous material. Both the secondary layer and the tertiary layer formed of a composite could be used for both electric and magnetic shielding of chips.

9 Claims, 5 Drawing Sheets

MAGNETIC AND ELECTRIC SHIELDING OF ON-BOARD DEVICES

BACKGROUND OF THE INVENTION

1. Field of the Invention

The invention relates to packaging of circuit board devices, and, in particular, to circuit board device magnetic and electric field shielding.

2. Description of Related Art

Motherboard designers today are faced with tighter electromagnetic compatibility ("EMC") regulations than previously. The Federal Communications Commission ("FCC") recently imposed the so-called "open box" electromagnetic interference ("EMI") testing criteria. The open box criteria transfers responsibility for regulation of computer system (i.e., unintentional radiator's) radiated energy produced by on-board components, such as application specific integrated circuits ("ASICs"), from a shielded enclosure (e.g., a computer case or enclosure) housing the components to the internal components themselves, specifically a motherboard. Such emissions, which previously could be sufficiently attenuated by the shielded enclosure to satisfy the prior "closed box" regulations, must now be sufficiently attenuated without the shielded enclosure being completely closed. The exposed motherboard must thereby satisfy the open box regulations without relying on the shielded enclosure to provide sufficient attenuation. Otherwise, a given motherboard can only be marketed with a particular case if, when closed, the case reduces the emissions sufficiently.

With the open box criteria, the FCC changed the procedure for testing computer devices for radiated emissions. The FCC's regulations were incorporated in amendments to § 15.32(a)(1) of Title 47 in the Code of Federal Regulations ("CFR"). These amendments were adopted for CPU boards or motherboards and power supplies. Because of difficulties associated with determining the efficacy of shielding with computer cases, the FCC did not adopt rules that authorize these enclosures. To ensure that computer systems assembled from modular components comply with the technical standards, the FCC adopted a two-step test procedure for authorizing the motherboards. The motherboard must first be tested when installed in a typical enclosure but with the enclosure's cover removed so that the internal circuitry is exposed at the top and on at least two sides of the enclosure. Other components, including a power supply, peripheral devices, and subassemblies are to be added, as needed, to complete the personal computer system. If the oscillator and the microprocessor circuits of the computer system are contained on separate circuit boards, both boards must be used in the test. Under this test procedure, radiated emissions from the system may be no more than 6 decibels ("dB") above the limits specified in § 15.109. These limits are shown in Table I below.

TABLE I

Field Strength Limits for Unintentional Radiators at a Distance of 3 Meters

| Frequency of Emission (MHz) | Field Strength (microvolts/meter) |
|---|---|
| 30–88 | 100 |
| 88–216 | 150 |
| 216–960 | 200 |
| >960 | 500 |

The testing is to be performed in accordance with the procedures specified in the measurement standards of § 15.31. If the initial test shows that the open box computer system exceeds 6 dB above the limits shown in Table I, a further test is performed using the same configuration, but with the enclosure completely closed with all covers installed. Under these test conditions, the computer system under test shall not exceed the radiation limits specified in § 15.109 of the rules. However, if the first test demonstrates that the computer system is in compliance with the radiation emission standards in § 15.109, it is not required that the additional test be performed. The system must also be tested for compliance with the AC power line conducted limits as specified in § 15.107, in accordance with the specified procedures in § 15.31. If emissions greater than 6 dB above the limits can be identified and documented as originating from components other than the motherboard, then these emissions may be dismissed.

The test procedure of § 15.32(a)(1) must be passed. Passing the first of the above tests, but failing the second, signifies a noncompliant product. If compliance cannot be demonstrated under the second test, then an alternative testing procedure is available in which the motherboard may be tested for compliance within the limits of § 15.109 using a specified enclosure with the cover installed. Such testing must also be in accordance with the procedure specified in § 15.31 and the motherboard that complies with the limits of § 15.109 must be marketed together with the specific enclosure used for the test.

PRIOR ART

Reference is now made to FIG. 1 which shows a system 50 encapsulating or covering a conventional device 12 (e.g., a chip) on a device board (e.g., a component board, a circuit board, a printed circuit board or PCB, a CPU board, a motherboard, and the like) known in the art. The encapsulation is integrated into the device packaging materials. One exemplary type of board that the device board could be is the motherboard of a computer system. In FIG. 1 the device board includes a surface 10 on which the device 12 is mounted as is well known in the art. The device 12 may be an integrated circuit component (or silicon die). The device 12 could be an ASIC, for example, a clock source, in addition to other types of devices. The device 12 may be coupled to conductive leads or components (not shown) by bond wires 14 through contacts 16 and 18 on or in the surface 10 and the device 12, respectively. The contacts 18 may be conductive contacts, ohmic contacts, Schottky barrier contacts, and the like, depending on the specific implementation of the system 50.

A "primary" layer 20 typically covers or encapsulates the device 12, the bond wires 14, and the contacts 16 and 18. However, due to other factors, for example, air bubbles or other imperfections, or by design, the primary layer 20 may only cover a portion of the device 12, the bond wires 14, and the contacts 16 and 18. The primary layer 20 is nonconductive and is formed from an industry standard encapsulant that is typically chemically resistant and thermally stable. The primary layer 20 may be, for example, an epoxy cresol novolac polymer (provided by Plaskon Singapore, Shinetsu, Nitto Denko, or others), or other polymer. Such nonconductive polymers are typically used in packaging material for integrated circuits, and they may be composite polymer matrix materials having various components. The primary layer 20 serves to protect the device 12 from possible oxidation, and to help maintain the structural integrity of the device 12, the bond wires 14, and the contacts 16 and 18, as is known in the art. However, the primary layer 20 offers no magnetic shielding or electric shielding for the device 12 for emitted (or received) radiated energy, and will not aid a given system in achieving compliance with the FCC open box regulations.

Thus, a need exists to shield device board components using device-appropriate shielding to facilitate compliance with the open box regulations instituted by the FCC. In the long term, this could simplify and reduce the cost of enclosing computer systems, perhaps allowing the use of plastic or other casing not constructed of conductive material.

SUMMARY OF THE INVENTION

In one aspect of the present invention, a system encapsulating a device on a device board is provided. The system includes a first polymer layer that covers a portion of the device, and a second polymer layer that covers a portion of the first polymer layer. The second polymer layer includes a polymer material and magnetically permeable particles.

In another aspect of the present invention, a system encapsulating a device on a device board having a ground is provided. The system includes a first polymer layer that covers a portion of the device and a conductive material that covers a portion of the first polymer layer and is coupled to the ground. The system also includes a second polymer layer that covers a portion of the first polymer layer and the conductive material, the second polymer layer including a polymer material and magnetically permeable particles.

BRIEF DESCRIPTION OF THE DRAWINGS

Other objects and advantages of the invention will become apparent upon reading the following detailed description and upon reference to the drawings in which.

Figure 1:
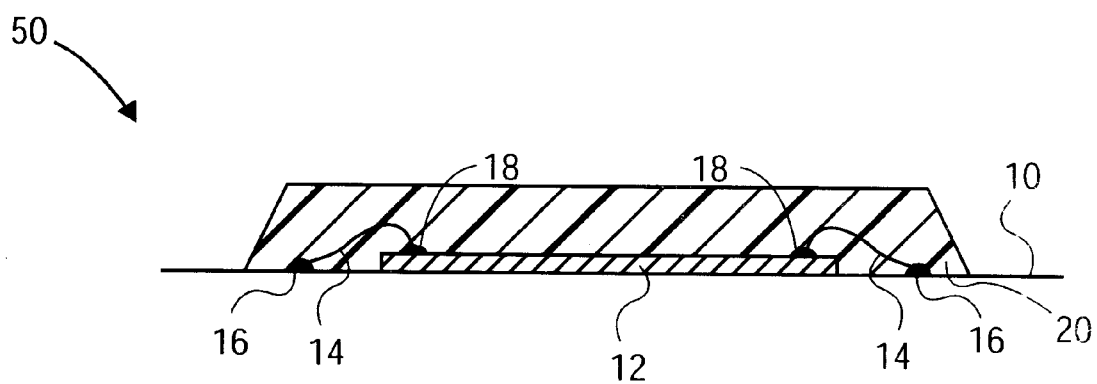
FIG. 1 is a prior art system of encapsulating a device on a device board.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

First Embodiment

Figure 2:
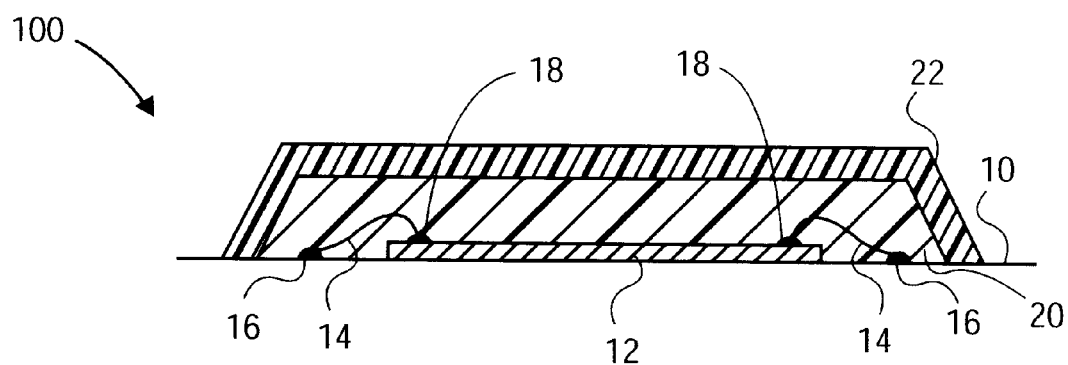
FIG. 2 is a system in accordance with a first embodiment of the invention.

Reference is now made to FIG. 2, which shows a system 100 encapsulating the device 12 on the surface 10 of a device board (i.e., the device 12 may be an on-board device) in accordance with a first embodiment of the invention. The system 100 is somewhat similar to the system 50 except for the provision of a "tertiary" layer 22 that encapsulates or covers completely, or covers a portion of (e.g., a substantial portion of), the primary layer 20 (the layer 22 is termed "tertiary" for reasons set forth below). Covering only a portion may be due to, for example, air bubbles, imperfections, or it may be done by design. However, for shielding purposes, complete or substantial covering, as understood by those skilled in the art in the context of the present invention, may be desirable to maximize shielding. (This discussion of covering applies to all embodiments of the present invention, and for any type of covering layer, not just those of the first embodiment.) The tertiary layer 22 may be a composite material, for example, a composite made of an industry standard encapsulant, such as the epoxy cresol novolac polymer, which is impregnated with magnetically permeable material particles. A high percentage of the total volume or mass of the tertiary layer 22 may be composed of these permeable particles, which may have a high magnetic permeability. Examples of high permeability material include ferrous materials, such as ferrite (a mixture of ferric oxide and oxides of other metals, such as manganese, nickel, zinc, and the like). A natural form of ferrite is hematite. Other high permeability material particles could be used.

In regions external to or outside the tertiary layer 22 (or outside the device 12 or the device board), for example, at 3 meters distance, the strength of the magnetic field, whose flux lines may emanate from the device 12, will be reduced because of the presence of the high permeability particles in the tertiary layer 22. A relatively large portion of the energy of these magnetic fields may be used to align the dipoles of the permeable particles in the tertiary layer 22, and the magnetic flux lines will tend to be contained within the permeable material in the tertiary layer 22. The tertiary layer 22 will also function to shield the device 12 from external magnetic fields derived from other sources for similar reasons. In making the composite material for the tertiary layer 22, the proportion of permeable particles to polymer material, and the thickness of the resulting tertiary layer 22 may be designed specifically to reduce magnetic field strength due to the device 12 in regions external to the tertiary layer 22. It is understood that this proportion and this thickness, which are determinable in the art, would be at least sufficient to bring about a reasonable reduction in magnetic field strength external to the system 100 (e.g., to prevent harmful effects on other systems or people), and could be capable of complying with any anticipated future regulations that may be instituted regarding external magnetic field strength.

Second Embodiment

Figure 3:
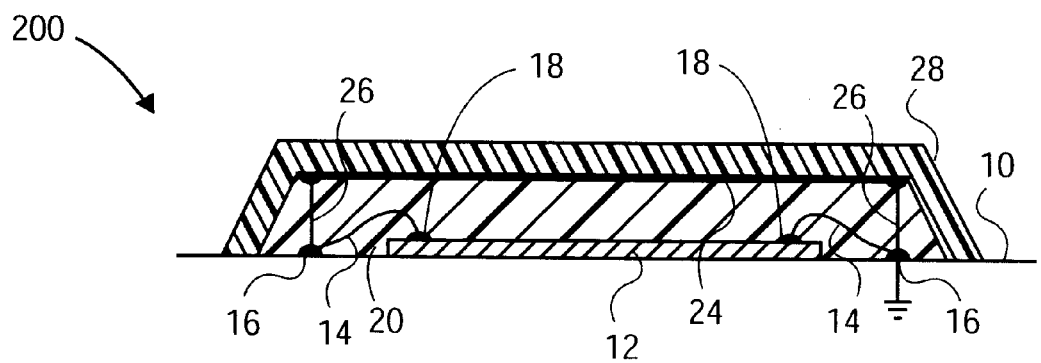
FIG. 3 is a system in accordance with a second embodiment of the invention.

Referring now to FIG. 3, a system 200 is shown in accordance with a second embodiment of the invention. The system 200 is somewhat similar to the system 100, but the system 200 does not include the tertiary layer 22. Instead, the system 200 includes a "secondary" layer 24 that is electrically conductive, and may be highly conductive. The secondary layer 24 is adjacent or layered on the primary layer 20 encapsulant, and may completely cover, or cover only a portion of, the layer 20. The secondary layer 24 also includes conductive shielding contacts or sections 26 coupled to the contact 16 which, in turn, are coupled to a device board ground (not shown in specific detail). The device contact 18 may also be coupled via the bond wire 14 to the device board ground. An encapsulant layer 28 is included that is adjacent or layered on (and covers all of, or a portion of, e.g., a substantial portion of) the secondary layer 24 and the primary layer 20, such that the secondary layer is disposed between the encapsulant layer 28 and the primary layer 20. The layer 28 differs from the tertiary layer 22 in the system 100 in that it contains no permeable particles. The layer 28 may be nonconductive, and it may be made from the same polymer material as is used in the primary layer 20, or it could be different.

The secondary layer 24 functions as a Faraday cage to effect electric shielding of radiated energy from the device 12 and reduce electric field strength in regions outside (e.g., at 3 meters distance) the secondary layer 24 (or the device 12 or the device board). Faraday cages, as known in the art, are used to shield electric fields. The secondary layer 24 may likewise shield the device 12 from electric fields from sources external to the system 100.

The secondary layer 24 may be made out of an electrically conductive metal or metal alloy (e.g., it may be a good conductor). Exemplary materials for the secondary layer 24 could be copper, gold, aluminum, or the like. These materials could be used in the form of foil material. Assuming that copper is used for the material of the secondary layer 24, an exemplary foil thickness of approximately 10 microns ($\approx 10^{-5}$ meters) may be sufficient to attenuate most radiated electric field energy at or above 100 MHz emanating from the device 12. The thickness sufficient to attenuate the energy at 100 MHz can be determined using the standard relationship between skin depth and frequency known in the art: $\delta = (\pi f \mu \sigma)^{-\frac{1}{2}}$ meters, where $\delta$ is the skin depth, f is the radiated energy temporal frequency, and $\mu$ is the magnetic permeability and $\sigma$ is the electrical conductivity of copper. Because the skin depth for copper foil is approximately 6.1 microns at 100 MHz, as determined by the above relationship, a thickness of approximately 10 microns (i.e., a thickness approximately the skin depth plus an additional fraction of the skin depth of the conductive material forming the secondary layer 24) should accommodate the currents induced by a majority of the frequencies shown in Table I higher than, as well as lower than, 100 MHz. To accommodate currents induced by even lower frequencies than the frequencies shown in Table I, the thickness of the secondary layer 24 could be further increased. The resulting reduction in radiated electric field strength due to the secondary layer 24 being present may be sufficient to bring the device board, onto which the system 200 is integrated, into compliance with the FCC regulations discussed above. Appropriate foil thickness and properly designed packaging of the device 12 should assure such compliance.

Third Embodiment

Figure 4:
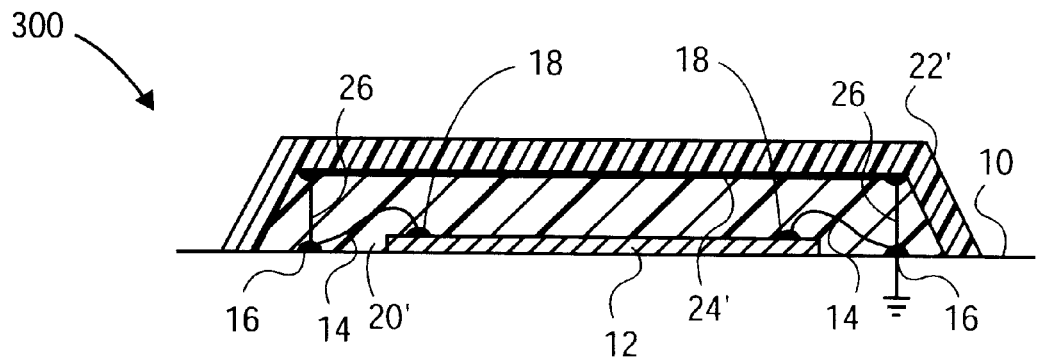
FIG. 4 is a system in accordance with a third embodiment of the invention.

Referring now to FIG. 4, a system 300 is shown in accordance with a third embodiment of the invention. The system 300 incorporates all the functionality of, and similar features to, both the systems 100 and 200 shown in FIGS. 1 and 2. The system 300 includes a primary layer 20' (similar to the primary layer 20), a secondary layer 24' (similar to the secondary layer 24), and a tertiary layer 22' (similar to the tertiary layer 22). The secondary layer 24' is adjacent or layered on (completely covering, or covering a portion of, e.g., a substantial portion of) the primary layer 20', analogous to the layering of the secondary layer 24 on the primary layer 20 in the system 200. Moreover, the tertiary layer 22' is adjacent or layered on (completely covering, or covering a portion of, e.g., a substantial portion of) the secondary layer 24', such that the secondary layer is disposed between the tertiary layer 22' and the primary layer 20', analogous to the layering of the encapsulant layer 28 on the secondary layer 24 in the system 200. (The inclusion of the terminology "primary," "secondary," and "tertiary" for the layers in the system 300 is the reason for the terminology used in the systems 100 and 200 above.) Such a configuration as the system 300 would be designed to be sufficient to reduce electrical energy radiating from the device 12 (e.g., at 3 meters distance) to bring the device board, onto which the system 300 is integrated, also into compliance with the open box regulations discussed above, as well as to reduce the magnetic field strength outside the system 300.

Any of the systems 100, 200, or 300 described above could be used in implementations that have highly susceptible ASICs as the device 12, such as super input/output ASICs (SIOs) with real-time clocks (RTCs), or other types of devices. These implementations could be made more EMI resilient without the addition of complicated and expensive secondary shielding hardware, such as hermetically sealed metal Faraday cages like those used for components in military applications, as specified in military specifications.

Method Embodiments

In the present invention, for any foregoing discussion about covering layers with polymer layers and for any such discussion that follows, it is assumed that the polymer layers may be cured by any known technique, for example, with temperature, with chemicals, with ultraviolet light, etc. It may be possible that any polymer curing process that would be used in the present invention would also help with the adherence or attachment of the conductive foil layer in the systems 200 and 300, for example to the layers 20 and 28, or 20' and 22'. Moreover, in the present invention, as discussed herein, covering a layer or layering on a layer includes the possibility that only a portion of the item being covered or layered on is actually covered (i.e., the covering may not be complete), due to, for example, imperfections, or by choice. Various methods of the present invention will now be discussed with reference to FIGS. 5–7.

Figure 5:
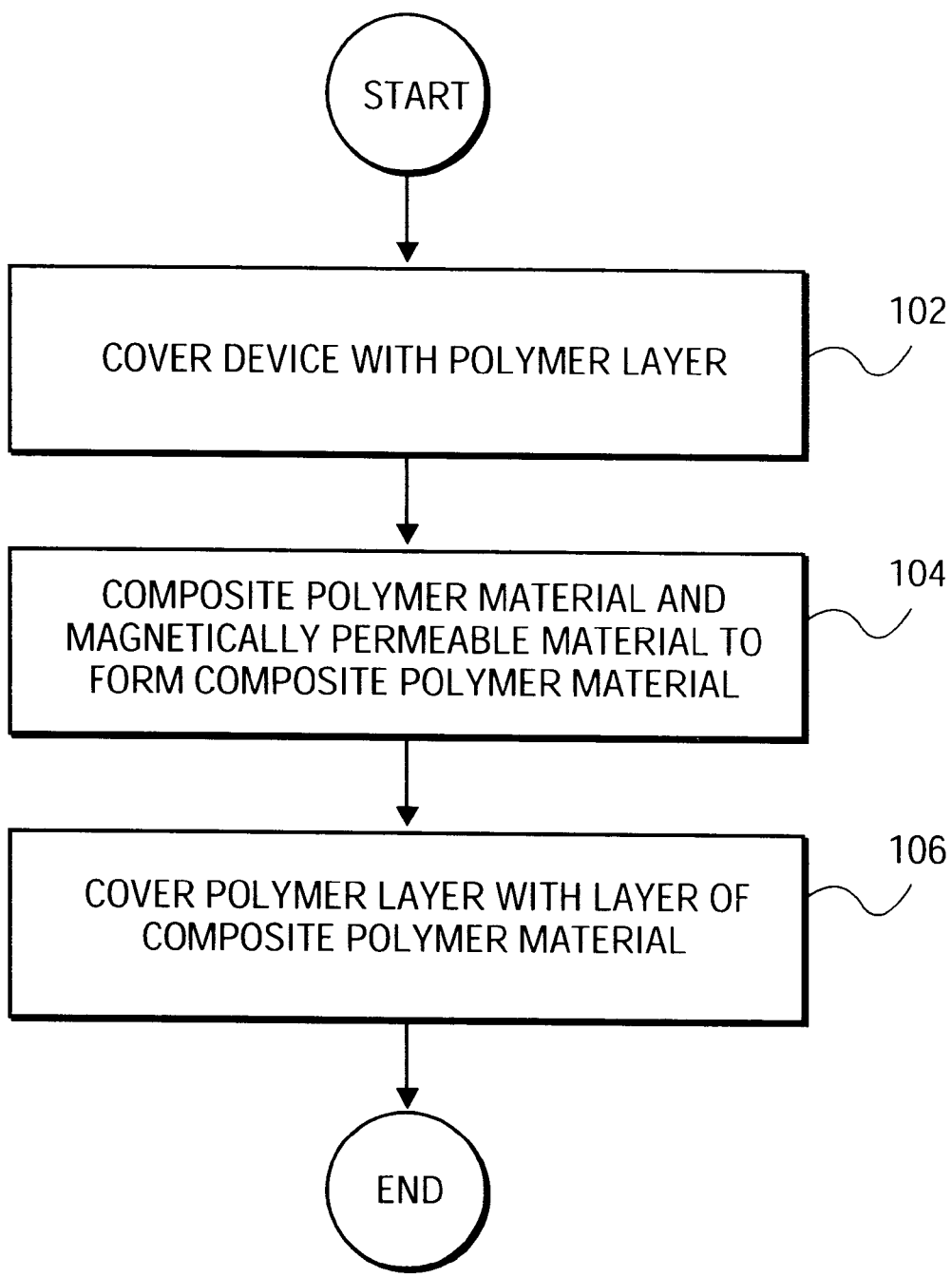
FIGS. 5–7 are flowchart representations of methods in accordance with embodiments of the invention.

Referring to FIG. 5, a flowchart representation is shown of a method of encapsulating a device (e.g., the device 12) on a device board (e.g., on the surface 10 in the system 100), in accordance with an embodiment of the invention. At block 102, the device is covered with a polymer layer (e.g., the primary layer 20, which may be an epoxy). At block 104, a polymer material and a magnetically permeable material are composited (i.e., mixed together using known techniques in the art, for example, the mixing of ferrous particles and polymers is well known in the art of electrophotography) to form a composite polymer material. At block 106, the polymer layer is covered with a layer of the composite polymer material (e.g., the tertiary layer 22 which may be a composited epoxy and magnetically permeable particles).

Figure 6:
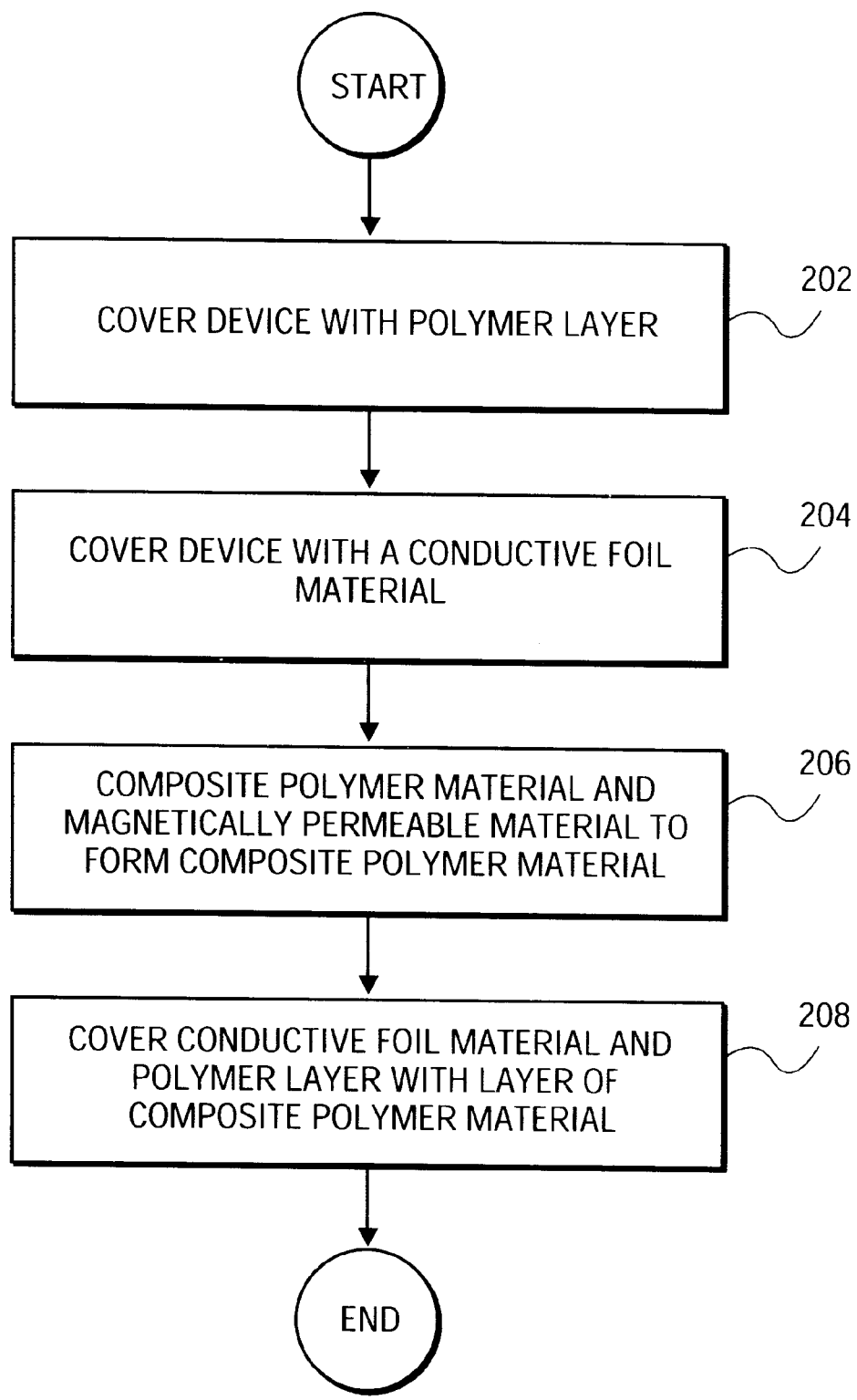

Referring now to FIG. 6, a flowchart representation is shown of a method of encapsulating a device (e.g., the device 12) on a device board (e.g., on the surface 10 in the system 200) having a ground in accordance with another embodiment of the invention. At block 202, the device is covered with a polymer layer (e.g., the primary layer 20'), and at block 204, the device is covered (e.g., also covering the first polymer layer) with a conductive foil material (e.g., the secondary layer 24'). The covering of the device may include attaching the conductive foil material to the first polymer layer and coupling the conductive foil material to the ground. At block 206, a polymer material (e.g., an epoxy) and a magnetically permeable material (e.g., ferrous particles) may be composited to form a composite polymer material, and at block 208, the conductive foil material and the polymer layer may be covered with a layer of the composite polymer material (e.g., the tertiary layer 22').

Figure 7:
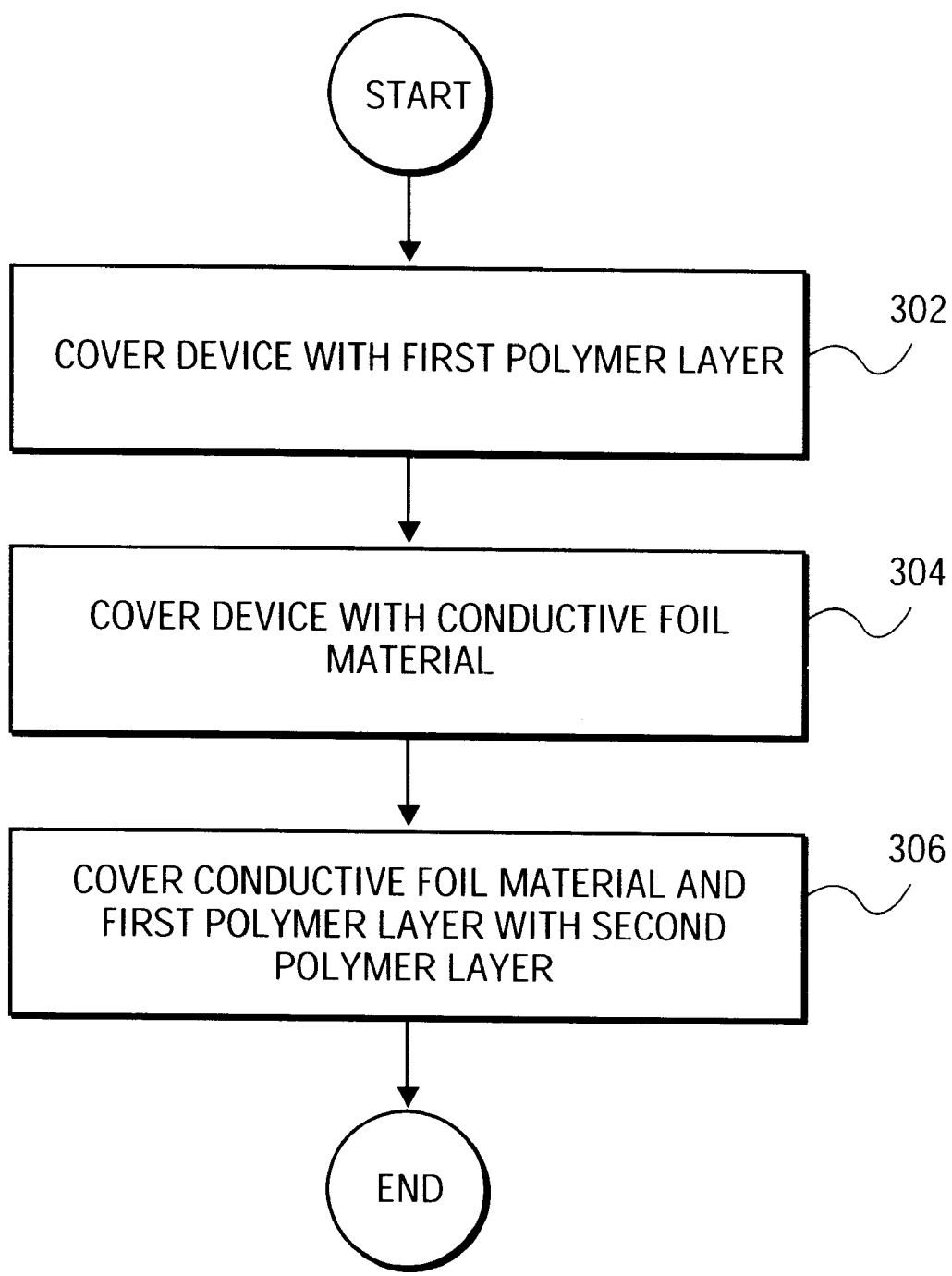

Referring now to FIG. 7, a flowchart representation is shown of a method of encapsulating a device (e.g., the device 12) on a device board (e.g., on the surface 10 in the system 300) having a ground. At block 302, the device is covered with a first polymer layer (e.g., the primary layer 20 which may be an epoxy). At block 304, the device is covered with a conductive foil material (e.g., the secondary layer 24). The covering of the device may include attaching the conductive foil material to the first polymer layer and coupling the conductive foil material to the ground. At block 306, the conductive foil material and the first polymer layer may be covered with a second polymer layer (e.g., the tertiary layer 28 which may be an epoxy).

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A system encapsulating a device on a device board, comprising:

a nonconductive polymer first layer covering a portion of the device;

an electrically grounded conductive second layer consisting of metal and covering the first layer, the second layer in direct contact with the first layer without an intervening layer between the first and second layers; and a polymer third layer covering the second layer, the third layer comprising
  a polymer material, and
  magnetically permeable particles including at least one of ferrous oxide and ferrite.

2. The system of claim 1, wherein the third layer comprises a composite material.

3. The system of claim 1, wherein the third layer comprises epoxy cresol nonvolac polymer.

4. The system of claim 1, wherein the magnetically permeable particles comprise high magnetic permeability material.

5. The system of claim 1, wherein the device comprises an integrated circuit coupled to the device board by bond wires.

6. The system of claim 5, wherein the integrated circuit comprises a silicon die.

7. The system of claim 1, wherein the third layer covers a substantial portion of the first layer.

8. The system of claim 1, wherein the third layer provides magnetic shielding.

9. The system of claim 1, wherein the second layer consists of metal foil.

* * * * *